United States Patent [19]

Seki

[11] Patent Number: 5,032,888
[45] Date of Patent: Jul. 16, 1991

[54] CONDUCTIVITY MODULATION BURIED GATE TRENCH TYPE MOSFET

[75] Inventor: Yasukazu Seki, Kanagawa, Japan

[73] Assignee: Fuji Electric Co., Ltd., Kanagawa, Japan

[21] Appl. No.: 555,770

[22] Filed: Jul. 23, 1990

[30] Foreign Application Priority Data

Aug. 25, 1989 [JP]  Japan .................................. 1-219285

[51] Int. Cl.$^5$ ..................... H01L 29/00; H01L 27/01; H01L 29/78; H01L 29/06
[52] U.S. Cl. .................................... 357/37; 357/23.1; 357/23.4; 357/55; 357/59
[58] Field of Search ..................... 357/23.4, 23.1, 55, 357/37, 38, 38 E, 59 G

[56] References Cited

U.S. PATENT DOCUMENTS 4,833,516  5/1989  Hwang et al. ..................... 357/55 X
4,967,245  10/1990  Cogan et al. ......................... 357/23.4

Primary Examiner—William Mintel
Assistant Examiner—Roy Potter
Attorney, Agent, or Firm—Finnegan, Henderson, Farabow, Garrett, and Dunner

[57] ABSTRACT

A conductivity modulation MOSFET with two base layers formed over a drain layer. A trench with a lower portion and an upper portion is formed in the second base layer. The lower portion of the trench has a fixed width, and the upper portion of the trench has a steadily increasing width relative to the lower portion. A gate is placed in the lower portion of the trench, while the source regions are formed in the second base region alongside the side walls of the upper trench portion.

16 Claims, 3 Drawing Sheets

CONDUCTIVITY MODULATION BURIED GATE TRENCH TYPE MOSFET

BACKGROUND OF THE INVENTION

1. Field of the Invention

The present invention relates to a conductivity modulation type MOSFET of the trench type in which a gate is buried in a trench excavated in a semiconductor substrate.

2. Description of the Prior Art

A conductivity modulation MOSFET is also called an insulated gate bipolar transistor (IGBT). A sectional view of an IGBT of the planar type is shown in FIG. 2. A p base layer 3 is formed in the surface region of an n− base layer 2. Base layer 2 is formed on a p+ layer 1 which serves as a drain layer. n+ source layers 4 are oppositely disposed and formed in the p base layer 3. A p+ layer 5 under both the source layers 4 is also formed in the p base layer 3. In order to form a channel in the surface region of the p base layer 3 located between the source layer 4 and the n− base layer 2, a gate oxide layer 7 is formed on the structure, and a gate polycrystalline silicon layer 6 is formed on the gate oxide layer 7. A gate polycrystalline silicon layer 6 is connected to a gate terminal G through a gate electrode 8. A source electrode 10, which is connected to a source terminal S at an opening of a PSG insulating layer 9 covering the gate 6, is in contact with the p+ layer 5 and the n+ source layers 4. A drain electrode 11 connected to a drain terminal D is in contact with the drain layer 1 layered on the other side of the semiconductor substrate.

When a voltage larger than a fixed threshold value is applied to the gate electrode 8 with respect to the source electrode 10, the surface region of the p base layer 3 under the gate polycrystalline silicon layer 6 is inverted, creating a channel in the surface region of the p base layer 3. A conductive state then exists between the source S and the drain D. With hole injection through the channel, the n− base layer 2 is subjected to conductivity modulation increasing conductivity and allowing a large current flow. The value of this current is 10 to 20 times the value of current of an ordinary vertical power MOSFET without p+ drain layer 1. This is a highly advantageous feature.

The IGBT of the planar type shown in FIG. 2 inevitably suffers from the junction type field effect transistor (JFET) effect. In the JFET effect, a depletion layer is created by a diffusion potential arising from the junction between the n− base layer 2 and the p base layer 3. Consequently, the path for electrons is narrowed. Once conductivity modulation occurs, the JFET effect problem is removed. However, delay occurs in the rise of the voltage vs. current characteristic curve. In this respect, the characteristic curve rises unsmoothly.

A trench type IGBT which is free from the JFET effect and has a reduced on-resistance is proposed by H. R. Chang in IEDM 87 (International Electron Devices report, page 674). FIG. 3 shows a sectional view of this type of IGBT. In this transistor, a p base layer 3 sandwiches a trench 12. A gate polycrystalline silicon layer 6 is buried in the trench 12 with a gate oxide film 7 between the gate 6 and base layer 3. When a voltage is applied to the gate 6, a channel is formed along a layer perpendicular to the substrate surface 22 of the trench 12, in the p base layer 3 located between an n− base layer 2 and an n+ source layer 4 formed in the surface region of the substrate.

The operation of the element thus structured will be described with reference to FIG. 4, which shows an equivalent circuit of the element whose structure is shown in FIG. 2 or FIG. 3. The circuit of FIG. 4 contains a base short resistor Rp, a pnp transistor 32, and an npn transistor 33, in addition to a MOSFET 31. The pnp transistor 32 is made of the p base layer 3, the n− base layer 2, and the p+ drain layer 1 as shown in FIG. 2 or FIG. 3. The npn transistor 32 is made of the n+ source layer 4, the p base layer 3, and the n− base layer 2 as shown in FIG. 2 or FIG. 3. The base short resistor Rp represents a resistor that is present when the p base layer 3 and the p+ layer 5 are connected in series to the source electrode. In operation, a voltage higher than a threshold voltage is applied to the gate. Then, when the MOSFET 31 is turned on, electrons flow from the source to the base of the pnp transistor, and the entire element itself turns on.

In the IGBT shown in FIG. 2 or FIG. 3, the gate 6 and the source electrode 10 are insulated by the insulating layer 9. If this insulating layer has a manufacturing defect, the gate and the source will be shorted. In the trench IGBT, whose gate area is smaller than that of the planar IGBT, the probability of a short circuit is slightly reduced, but is very difficult to entirely eliminate the problem.

SUMMARY OF THE INVENTION

An object of the present invention is to provide a transistor free from short circuits.

An additional object is the formation a gate and a source of an IGBT of the trench type which is free from the JFET effect and has a small on-resistance.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the above objects, a conductivity modulation MOSFET having a drain layer of a first conductivity type; a first base layer of a second conductivity type formed on the drain layer; a second base layer of the first conductivity type formed on the first base layer; a trench having a lower portion and an upper portion formed in the second base layer, with the lower portion of the trench having a fixed width and the upper portion of the trench having a steadily increasing width relative to the lower portion; a source layer of the second conductivity type formed in the second base layer adjacent to the upper portion of the trench; a gate in the lower portion of the trench; and an insulating film in the lower portion of the trench between the gate and the side walls of the trench, with the insulating film contacting both the gate and the side walls of the trench is provided.

The bottom surface of the trench having vertical lower sidewalls and outwardly expanding upper sidewalls may be the upper horizontal surface of the first base layer.

The upper portion of the trench is filled with an insulation film to provide additional insulation for the gate in the lower portion of the trench.

The lower end of the source layer adjacent the upper layer of the trench extends to but not beyond the lower portion of the trench.

When a voltage is applied to the gate, a channel is formed in a portion of the second base layer of the first conductivity type which is in contact with the vertical side wall of the trench. Electrons flow through the channel from the source layer to the first base layer of the second conductivity type. This state corresponds to the on state of the MOSFET 31 shown in FIG. 4.

The gate is only present in the lower portion of the trench, and an insulating layer is placed between the gate and the sidewalls of the trench. Therefore, the electrical insulation of the gate from the source is reliable, and the possibility of a short circuit between the gate and the source is greatly reduced.

DESCRIPTION OF THE DRAWINGS

The accompanying drawings, which are incorporated in and constitute a part of this specification illustrate embodiments of the invention and, together with the description, serve to explain the principles of the invention.

In the figures, like references numbers refer to similar or like parts.

DETAILED DESCRIPTION OF THE PREFERRED EMBODIMENTS

Figure 1:
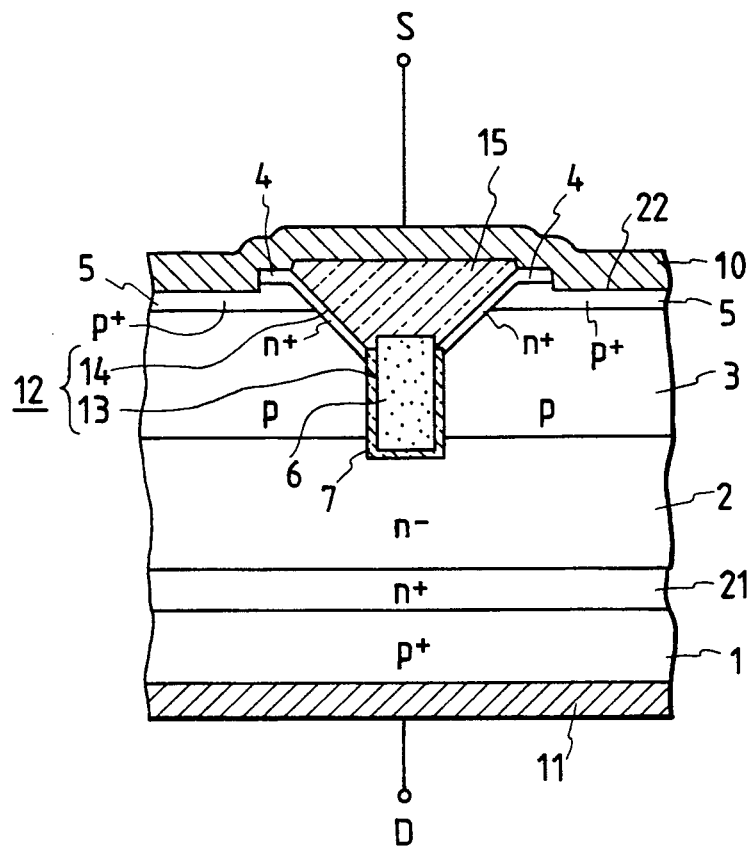
FIG. 1 shows a sectional view of the first embodiment of the present invention.
Figure 2:
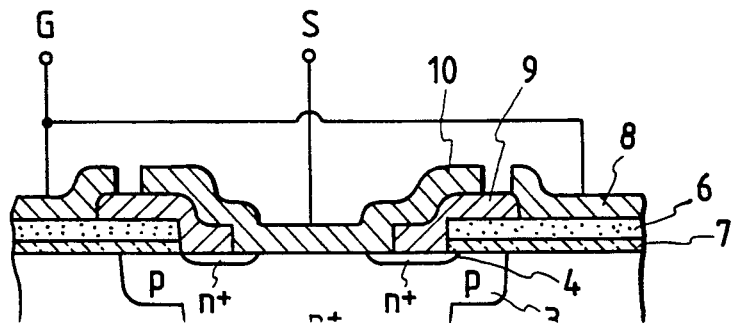
FIG. 2 shows a sectional view of a conventional IGBT of the planar type.
Figure 3:
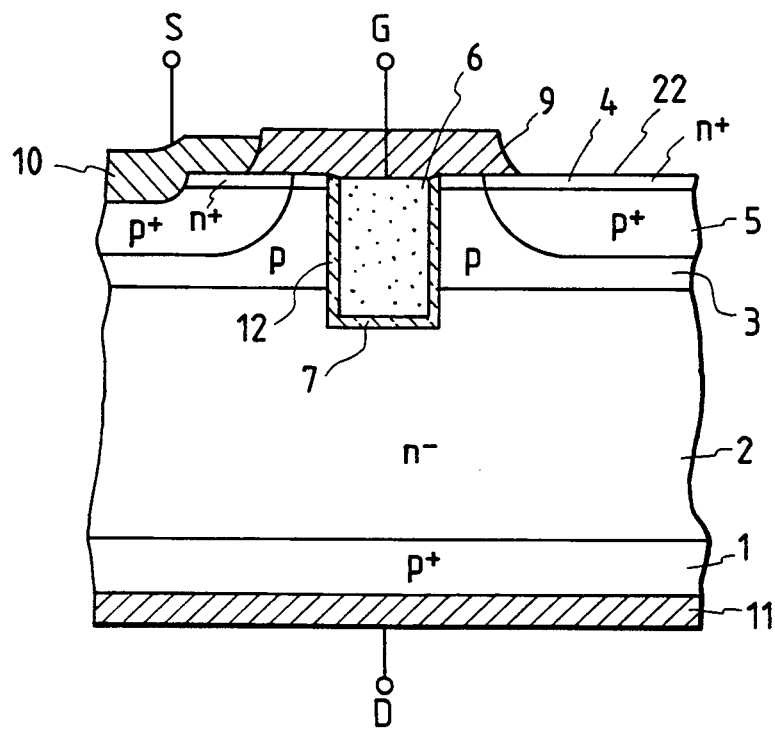
FIG. 3 shows a sectional view of an IGBT of the trench type.
Figure 4:
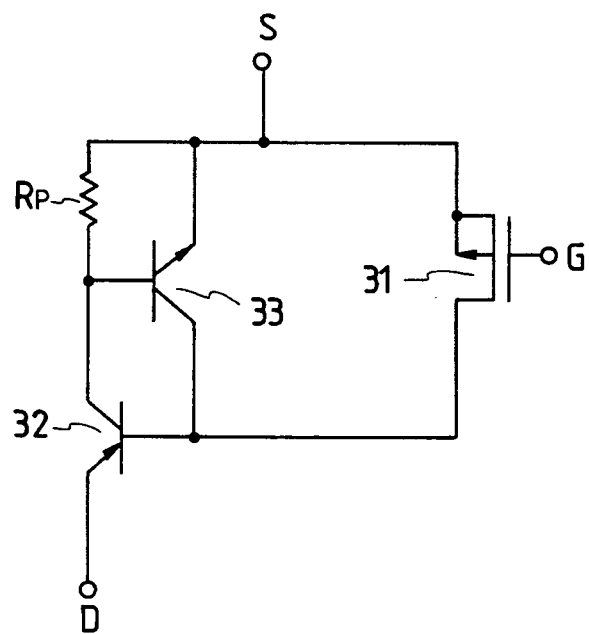
FIG. 4 shows an equivalent circuit of the element whose structure is shown in FIG. 2 or 3.

FIG. 1 shows a sectional view of the first embodiment of the present invention.

Referring to FIG. 1, an n+ buffer layer 21 is formed on a p+ drain layer 1. A first n− base layer 2 is formed on the buffer layer 21, and a second p base layer 3 is formed on the first base layer 2. A trench 12 is formed on the second base layer 3. The trench 12 reaches the first base layer 2.

The trench 12 includes a lower portion 13 with side walls vertical to the substrate surface 22, and an upper portion 14 with side walls extending outwardly and obliquely with respect to the substrate surface 22. Therefore, the lower portion 13 of the trench 12 has a fixed width, while the upper portion 14 of the trench 12 has a steadily increasing width relative to the lower portion of the trench.

An n+ layer 4 is formed in contact with the side wall of the upper portion 14 of the trench 12 and a part of the substrate surface 22. A gate poly crystalline silicon 6 fills only the lower portion 13 of the trench 12. A gate oxide layer 7 is interlayered between the lower portion 13 and the gate polycrystalline silicon 6. The upper portion 14 is filled with an oxide layer 15. An n+ buffer layer 21 is formed on the side of an n− base layer 2 that is closer to a drain layer 1. A p+ layer 5 is formed over and in parallel with the substrate surface 22.

When a voltage higher than the threshold voltage of the gate 6 is applied between a source terminal S through a source electrode 10 and a drain terminal D through a drain electrode 11, a part of a p base layer 3 layered beside the gate oxide film 7 is inverted to form a channel vertical to the substrate surface 22. Electrons flow to the n− base layer 2, through the source electrode 10 and the formed channel. Responsively, holes flow from the drain layer 1 to the n− base layer 2, through the n+ buffer layer 21. The trench IGBT is subjected to a conductivity modulation and the resistance of the trench IGBT itself is reduced. If the voltage applied to the gate 6 is stopped, the flow of electrons will be shut off and, hence, a principal current is shut off.

A process for manufacturing the IGBT shown in FIG. 1 will be described with reference of FIGS. 5(a) to 5(e).

An n+ layer 21 with a resistivity between 0.1 to 0.3 ohm cm and a thickness of 10 um and an n− layer 2 are formed on a p+ substrate 1 by an epitaxial process. Substrate 1 is preferably 500 um thick and has a resistivity of 0.018 ohm cm. For an element whose breakdown voltage is 600 V, the base layer is designed to have resistivity of 50 ohm cm and thickness of 60 um. For an element whose breakdown voltage is 1200 V, the base layer is designed to have resistivity of 100 ohm cm and thickness of 90 um. Boron ions are implanted in the surface of the n− layer 2 in a concentration of $5 \times 10^{13}/cm^2$. The resultant structure is annealed, to form a p base layer 3 which is 10 um thick.

A trench 12 is formed by reactive ion etching process using a reactive gas of chlorine or its family members. The trench 12 as formed by the dry etching of reactive ion etching (RIE) and includes a lower portion 13 with vertical side walls and an upper portion 14 with side walls that are outwardly slanted. The trench is 6 to 7 um wide at the top, and it is approximately 3 um wide at the bottom. Arsenic ions are implanted over an area including the slanted surface of the upper portion 14 of the trench and part of the upper surface of the p base layer 3, in a concentration of $5 \times 10^{15}/cm^2$. The resultant structure is annealed to form an n+ source layer 4. Then, the surface of the structure is thermally oxidized, to form an oxide film 7. Afterwards, polycrystalline silicon is deposited to have a thickness of 3 um by the decompression CVD method, thereby a polycrystalline silicon layer 60 is formed as shown in FIG. 5(b).

Figure 5A:
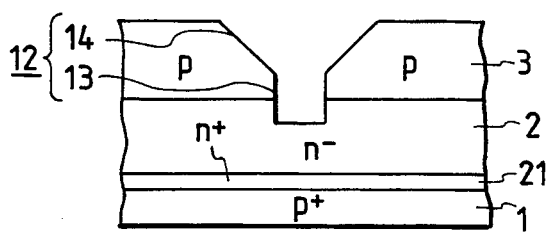
FIGS. 5(a) through 5(e) show process steps of manufacturing the IGBT shown in FIG. 1.
Figure 5D:
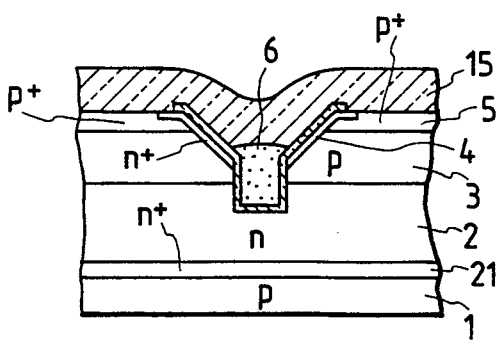
Figure 5B:
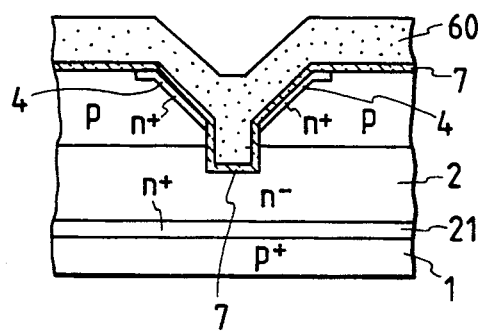
Figure 5E:
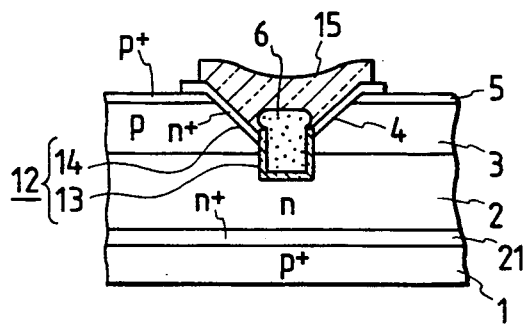
Figure 5C:
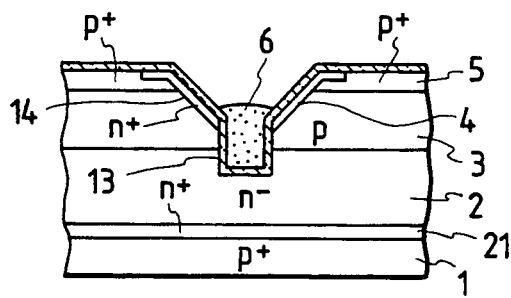

In FIG. 5(c), the polycrystalline silicon layer 60, except the portion filling the lower portion 13 of the trench 12, is etched away by dry etching process using Cl reaction gas. As a result, a gate poly crystalline silicon 6 is formed. The reaction gas may be $CF_4$ or $SF_6$. Boron ions in a concentration of $1 \times 10^{15}/cm^2$ are implanted into the surface of the structure, and the resultant structure is then annealed, to form a p+ layer 5. The p+ layer 5 provides contact with the source electrode and prevents latch-up because it reduces the base-short resistance Rp.

In the next step shown in FIG. 5(d), a cold oxide film is deposited by the decompression CVD method, to form an oxide layer 15 1.5 to 3 um thick with a substantially flat surface. The oxide layer 15 is selectively etched away, leaving only a portion of the layer covering the gate 6 and filling the upper portion 14 of the trench 12.

An Al-Si alloy is sputtered to a thickness of 3 to 5 um, to form a metal electrode over the entire surface, which serves as the source electrode 10. The result is to complete the IGBT element shown in FIG. 1. A gate terminal is lead out of the gate 6 at a location not shown.

The IGBT element thus formed is of the n-channel type. If the conductivity of each layer is inverted, the resultant element is of the p-channel type.

In the case of an IGBT whose current capacity is 50A, 30,000 cells, each structured as shown in FIG. 1, are formed on a single chip 8.2 mm × 8.2 mm. At 600 V of breakdown voltage, in the IGBT of the planar type, the total non-defective rate is 60 to 70%. On the other hand, in the IGBT of the trench type according to the present invention, the short circuit defects, accounting for approximately half of all of the defects, are eliminated, and the total non-defective rate is improved to 80 to 85%.

As seen from the foregoing description, in the IGBT of the trench type, the gate is buried in the lower portion of a trench. A source layer is formed along the slanted surface of the upper portion of the trench. The gate is closed by filling the upper portion of the trench with an insulating layer. With such an arrangement, there will never be a short circuit between the gate and the source, eliminating a major cause of the defects in an IGBT element. Further, use of the vertical channel elongates the total length of channel per fixed element area. This feature reduces an element's resistance when it is in an on state. Furthermore, the JFET effect is negligible which smooths the rise of the current vs. voltage characteristic of the trench type IGBT element. Thus, the IGBT element according to the present invention can make the best use of the major advantageous features, low on-resistance and the removal of the JFET effect.

The foregoing description of preferred embodiments of the invention has been presented for purposes of illustration and description. It is not intended to be exhaustive or to limit the invention to the precise form disclosed, and obviously many modifications and variations are possible in light of the above teachings or may be acquired from practice of the invention. The embodiments were chosen and described in order to best explain the principles of the invention and its practical application to thereby enable one skilled in the art to best utilize the invention in various embodiments and with various modifications as are suited to the particular use contemplated. It is intended that the scope of the invention be defined by the claims appended hereto.

What is claimed is:

1. A conductivity modulation MOSFET, comprising:
   a drain layer of a first conductivity type;
   a first base layer of a second conductivity type formed on the drain layer;
   a second base layer of the first conductivity type formed on the first base layer;
   a trench formed in the second base layer and reaching the first base layer, the trench having a lower portion and an upper portion, the lower portion of the trench having a fixed width and the upper portion of the trench having a steadily increasing width relative to the lower portion;
   a source layer of the second conductivity type formed in the second base layer adjacent to the upper portion of the trench;
   a gate exclusively in the lower portion of the trench; and
   an insulating film in the lower portion of the trench between the gate and the side walls of the trench.

2. A conductivity modulation MOSFET as claimed in claim 1, further comprising a second insulating layer filling the upper portion of the trench.

3. A conductivity modulation MOSFET as claimed in claim 2, wherein the source adjacent the upper portion of the trench extends to and only to the lower portion of the trench.

4. A conductivity modulation MOSFET as claimed in claim 3, further comprising a second source layer of the second conductivity type formed in the second base layer adjacent to the upper portion of the trench on the opposite side of the trench as the first source layer.

5. A conductivity modulation MOSFET, comprising:
   a drain layer of a first conductivity type;
   a first base layer of a second conductivity type having a horizontal upper surface formed on the drain layer;
   a second base layer of the first conductivity type formed on the horizontal upper surface of the first base layer;
   a trench formed in the second base layer and reaching the first base layer, the trench having a lower portion and an upper portion, the lower portion of the trench having vertical side walls and the upper portion of the trench having side walls extending outward from the vertical side walls of the lower portion of the trench;
   a source layer of the second conductivity type formed in the second base layer adjacent to the upper portion of the trench;
   a gate exclusively in the lower portion of the trench; and
   a second insulating film in the lower portion of the trench between the gate and the side walls of the trench.

6. A conductivity modulation MOSFET as claimed in claim 5, wherein the horizontal upper surface of the first base layer is the bottom of the trench.

7. A conductivity modulation MOSFET as claimed in claim 6, wherein the source adjacent the upper portion of the trench extends to and only to the lower portion of the trench.

8. A conductivity modulation MOSFET as claimed in claim 7, further comprising a second insulating layer filling the upper portion of the trench.

9. A conductivity modulation MOSFET as claimed in claim 8, further comprising a second source layer of the second conductivity type formed in the second base layer adjacent to the upper portion of the trench on the opposite side of the trench as the first source layer.

10. A conductivity modulation MOSFET, comprising:
    a drain layer of a first conductivity type;
    a buffer layer formed on the drain layer;
    a first base layer of a second conductivity type formed on the drain layer;
    a second base layer of the first conductivity type formed on the first base layer;
    a trench formed in the second base layer and reaching the first base layer, the trench having a lower portion and an upper portion, the lower portion of the trench having a fixed width and the upper portion of the trench having a steadily increasing width relative to the lower portion;
    a source layer of the second conductivity type formed in the second base layer adjacent to the upper portion of the trench;
    a gate exclusively in the lower portion of the trench; and
    an insulating film in the lower portion of the trench between the gate and the side walls of the trench, the insulating film contacting both the gate and the side walls of the trench.

11. A conductivity modulation MOSFET as claimed in claim 10, further comprising a second insulation layer filling the upper portion of the trench.

12. A conductivity modulation MOSFET as claimed in claim 11, wherein the source adjacent the upper portion of the trench extends to and only to the lower portion of the trench.

13. A conductivity modulation MOSFET as claimed in claim 12, further comprising a second source layer of the second conductivity type formed in the second base layer adjacent to the upper portion of the trench on the opposite side of the trench as the first source layer.

14. A conductivity MOSFET as claimed in claim 2, further comprising a source electrode formed over the second base layer, the source electrode in electrical contact with the source layer.

15. A conductivity MOSFET as claimed in claim 8, further comprising a source electrode formed over the second base layer, the source electrode in electrical contact with the source layer.

16. A conductivity MOSFET as claimed in claim 11, further comprising a source electrode formed over the second base layer, the source electrode in electrical contact with the source layer.

* * * * *